United States Patent
Suh

(10) Patent No.: US 8,100,314 B2
(45) Date of Patent: Jan. 24, 2012

(54) CARBON NANOTUBES SOLDER COMPOSITE FOR HIGH PERFORMANCE INTERCONNECT

(75) Inventor: Daewoong Suh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 12/690,052

(22) Filed: Jan. 19, 2010

(65) Prior Publication Data
US 2010/0126631 A1 May 27, 2010

Related U.S. Application Data

(62) Division of application No. 11/313,344, filed on Dec. 20, 2005, now abandoned.

(51) Int. Cl.
| | |
|---|---|
| A47J 36/02 | (2006.01) |
| B23K 31/00 | (2006.01) |
| B23K 35/12 | (2006.01) |
| B23K 31/02 | (2006.01) |
| B23K 1/00 | (2006.01) |
| B23K 35/34 | (2006.01) |
| F01N 13/18 | (2010.01) |
| H01L 21/44 | (2006.01) |

(52) U.S. Cl. .......... 228/101; 228/180.22; 228/246; 228/248.1; 228/178; 228/245; 228/175; 228/176; 438/612; 148/24

(58) Field of Classification Search ............ None
See application file for complete search history.

(56) References Cited

U.S. PATENT DOCUMENTS

| | | | |
|---|---|---|---|
| 4,699,763 A | 10/1987 | Sinharoy et al. | |
| 6,283,812 B1 | 9/2001 | Jin et al. | |
| 6,919,063 B2 | 7/2005 | Jang et al. | |
| 7,125,502 B2 | 10/2006 | Smalley et al. | |
| 7,600,667 B2* | 10/2009 | Hwang ................... | 228/180.22 |
| 7,713,858 B2* | 5/2010 | Raravikar et al. ............ | 438/612 |
| 2003/0077478 A1 | 4/2003 | Dani et al. | |
| 2003/0089892 A1 | 5/2003 | Fox et al. | |
| 2003/0170166 A1 | 9/2003 | Smalley et al. | |
| 2004/0151885 A1 | 8/2004 | Jayaraman et al. | |
| 2004/0262779 A1 | 12/2004 | Amagai et al. | |
| 2005/0061496 A1 | 3/2005 | Matabayas, Jr. | |
| 2005/0075443 A1 | 4/2005 | Noguchi et al. | |
| 2005/0139642 A1* | 6/2005 | Koning et al. ................ | 228/245 |
| 2005/0161489 A1 | 7/2005 | Pikulski | |

(Continued)

FOREIGN PATENT DOCUMENTS

| | | |
|---|---|---|
| DE | 69603387 | 11/1999 |
| WO | WO 2005/031864 A1 | 9/2004 |
| WO | 2006048844 A1 | 5/2006 |

(Continued)

OTHER PUBLICATIONS

Kang et al.; Relationship Between Field Emission Property and Composition of Carbon Nanotube Paste for Large Area Cold Cathode; J. Vac. Sci. Technol. B; 22(3), 1345-1348; Jun. 2004.*

(Continued)

Primary Examiner — Melvin Mayes
Assistant Examiner — Guinever Gregorio
(74) Attorney, Agent, or Firm — Blakely, Sokoloff, Taylor & Zafman LLP

(57) ABSTRACT

An embodiment of the present invention is an interconnect technique. Carbon nanotubes (CNTs) are prepared. A CNT-solder composite paste is formed containing the CNTs and solder with a pre-defined volume fraction.

15 Claims, 6 Drawing Sheets

U.S. PATENT DOCUMENTS

2006/0067852 A1  3/2006 Suh et al.
2008/0078813 A1* 4/2008 Hwang .................. 228/101
2008/0110531 A1* 5/2008 Schmid et al. ........... 148/24

FOREIGN PATENT DOCUMENTS

WO    WO 2006048844 A1 * 5/2006

OTHER PUBLICATIONS

Zhang et al.; Metal coating on suspended carbon nanotubes and its implication to metal-tube interaction; Chemical Physics Letters, 331, pp. 35-41; Nov. 24, 2000.*

Zhang, Y., et al., "Metal Coating on Suspended Carbon Nanotubes and its Implication to Metal-Tube Interaction", Chem. Phys. Letters, 331, pp. 35-41, 2000.

International Search Report and Written Opinion of the International Searching Authority Dated Jan. 2, 2008, International Application No. PCT/US2006/046889.

Patent Abstracts of Japan, Japanese Application No. 2000-223005, Filed, Jan. 24, 2000, Applicant Lucent Technol Inc.

* cited by examiner

CARBON NANOTUBES SOLDER COMPOSITE FOR HIGH PERFORMANCE INTERCONNECT

CROSS-REFERENCES TO RELATED APPLICATIONS

This is a Divisional Application of U.S. patent application Ser. No. 11/313,344, filed Dec. 20, 2005, now abandoned. This Divisional Application claims the benefit of the U.S. patent application Ser. No. 11/313,344.

BACKGROUND

1. Field of the Invention

Embodiments of the invention relate to the field of nanotechnology, and more specifically, to carbon nanotubes.

2. Description of Related Art

Carbon nanotubes (CNTs) are promising elements in nanotechnology. They are fullerene-related structures which consist of graphene cylinders. Applications that may be benefited using carbon nanotubes include high thermal conductivity materials for future packaging thermal demands. The solders used in interconnect between the silicon (Si) die and the substrate have inherently lower resistance to electro-migration primarily due to their electrical resistivity and lower strength or modulus.

Typical solder has a critical product of electro-migration value approximately $10^2$ times lower than copper (Cu), which is used in metallization in silicon die. The critical current density beyond which electro-migration may become a problem is approximately $10^6$ A/cm$^2$ for Cu. Therefore, the critical current density beyond which electro-migration may become a problem is approximately $10^4$ A/cm$^2$ for solder because it is $10^2$ times lower than Cu. In other words, the existing solder may face serious electro-migration risk when the current density reaches approximately $10^4$ A/cm$^2$. This current density is being approached by existing technology. Presently, the solder electro-migration is driven by the interfacial reaction and/or defect (e.g., void or trapped filler) not necessarily by the inherent electro-migration in the solder. Although the electro-migration issues may be addressed by other techniques, the solder soon faces electro-migration risk because it starts to be subject to intensive electro-migration damage at current densities around or greater than $10^4$ A/cm$^2$.

BRIEF DESCRIPTION OF THE DRAWINGS

Embodiments of invention may best be understood by referring to the following description and accompanying drawings that are used to illustrate embodiments of the invention. In the drawings.

DESCRIPTION

Figure 1:
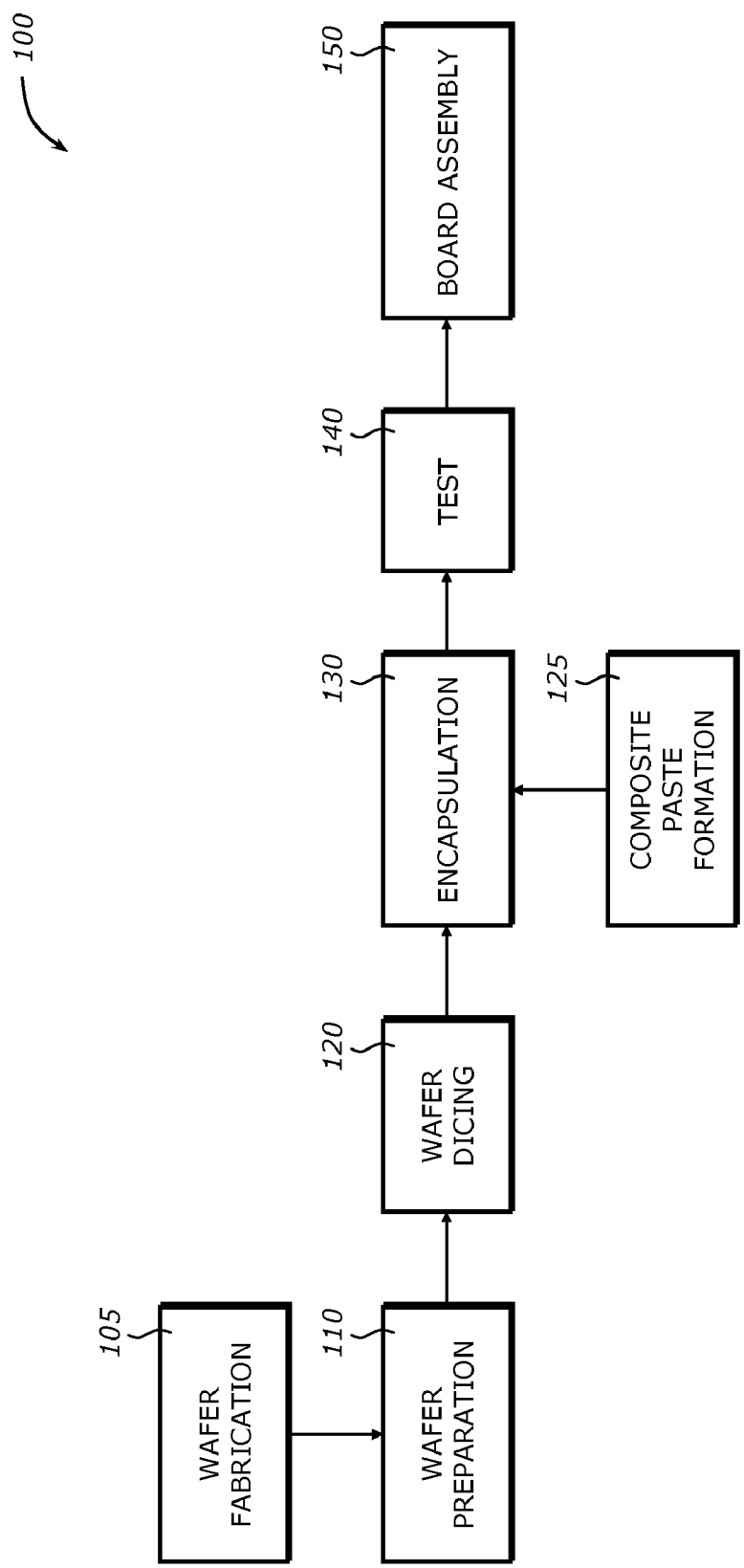
FIG. 1 is a diagram illustrating a system in which one embodiment of the invention may be practiced.

An embodiment of the present invention is an interconnect technique. Carbon nanotubes (CNTs) are prepared. A CNT-solder composite paste is formed containing the CNTs and solder with a pre-defined volume fraction. The CNT-solder composite paste may then be applied to an interconnect between a die and a substrate.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to form a composite paste for high performance interconnects. The composite paste may be used in any interconnect applications such as die attachment to a package substrate. The composite paste includes carbon nanotubes (CNTs) dispersed within a solder paste with a pre-defined volume fraction. The solder paste includes a mixture of solder powder and a paste ingredient. The CNTs may be metallic single-wall or multi-wall CNTs.

The CNTs have thermal and electrical properties that are superior to those of metallic materials in several aspects. First, a metallic single-wall or multi-wall CNT is a ballistic conductor, along the tube axis, independent of the tube length. For example, metallic CNTs with lengths of 5-10 μm may have electrical resistivity several times lower that that of copper (Cu) or silver (Ag). Second, CNTs have extraordinary current carrying capability without failure exceeding $10^9$ A/cm$^2$ due to their strong covalent bonding. Experiments show that CNTs may show no degradation at current density of $10^9$ A/cm$^2$ at 250° C. for more than 300 hours. Third, CNTs exhibit very high thermal conductivity of approximately 3,000 W/Km along the tube axis. This thermal conductivity far exceeds the best metallic material such as copper which has a conductivity of only about 420 W/Km, or even diamond with a conductivity of about 2,000 W/Km. By incorporating CNTs in solder paste for use in microelectronic interconnects, the solder technology may be extended beyond the current density of $10^4$ A/cm$^2$. The resulting CNT-solder composite paste provides many advantages. First, CNT serves a high electrical conductance path. Second, electron wind through the solder is reduced due to preferential electrical conductance through the CNTs, resulting in reduced electro-migration damage in the solder. Third, CNTs strengthen the solder matrix, leading to enhanced reliability.

FIG. 1 is a diagram illustrating a system 100 in which one embodiment of the invention can be practiced. The system 100 includes a wafer fabrication phase 105, wafer preparation phase 110, a wafer dicing phase 120, a composite paste formation phase 125, an encapsulation phase 130, a testing phase 140, and a board assembly phase 150. The system 100 represents a manufacturing flow of a semiconductor packaging process.

The wafer fabrication phase 105 fabricates the wafer containing a number of dice. The individual dice may be any microelectronic devices such as microprocessors, memory devices, interface circuits, etc. The wafer fabrication phase 105 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or more recently copper. The various metal layers are interconnected by etching holes, called "vias," in the insulating material.

The wafer preparation phase 110 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 120 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The composite paste formation phase 125 fabricates or manufactures a composite paste used in various interconnect tasks in the assembly. These may include die attachment in the encapsulation phase 130 or package attachment in the board assembly phase 150. The composite paste has CNTs dispersed in a solder paste to reduce electro-migration damage, strengthen solder matrix, enhance reliability, and provide high electrical conductance path.

The encapsulation phase 130 encapsulates the dice and the package substrates. The dice may be homogeneous or heterogeneous. The encapsulation includes printing the composite paste using the composite paste provided by the composite paste formation phase 125, placing the dice, flip-chip fluxing and placement, reflowing, inspection, under-fill dispensing and curing, etc. Integrated heat spreader (IHS) may be attached to the die and substrate assembly. The encapsulated assembly of the dice and substrate becomes a package ready to be tested.

The testing phase 140 performs one or more tests on the package under various conditions. The test may be highly accelerated stress test (HAST) or biased-HAST. The package may be powered or non-powered. The testing phase 140 may be optional.

The board assembly phase 150 assembles the package into a printed circuit board. This phase attaches the device package to the board. This phase may include various soldering processes, reflow, testing, and inspection. The composite paste provided by the composite paste formation phase 125 may be used in the soldering processes and reflow. The assembled board is then installed into a platform in a system or unit.

Figure 2A:
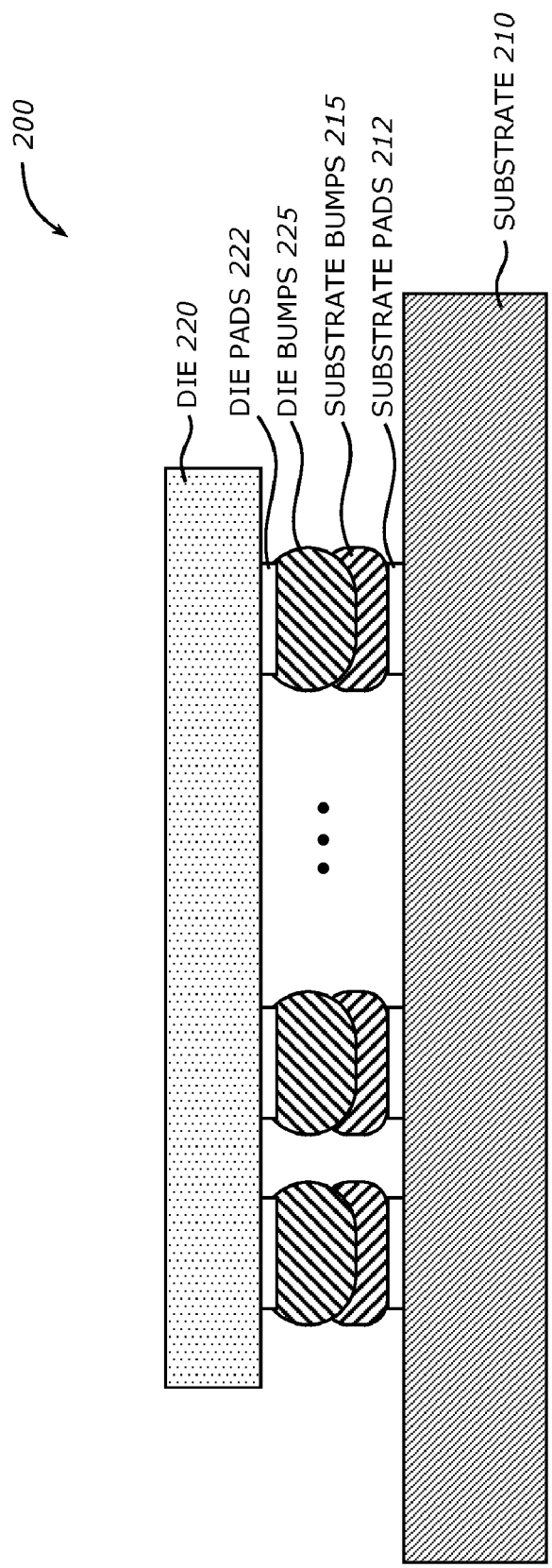
FIG. 2A is a diagram illustrating a package according to one embodiment of the invention.

FIG. 2A is a diagram illustrating a package 200 in which one embodiment of the invention can be practiced. The package 200 represents a package completed in the encapsulation phase 130 shown in FIG. 1. It includes a substrate 210 and a die 220.

The substrate 210 is a package substrate 210 that provides support and electrical interconnects for the die 220. The substrate 210 may be any suitable material such as silicon or any ceramic or polymeric substrate. The substrate 210 has substrate pads 212 and substrate bumps 215. The substrate pads 212 are placed on the top surface of the substrate 210 and provide contact points for interconnections with the die 220. The substrate bumps 215 provide solder bumps to be attached to the die 220. In some packaging technologies, the substrate bumps 215 may be optional.

The die 220 is any semiconductor die. It may have a microelectronic device such as a microprocessor, a memory, an interface chip, an integrated circuit, etc. The die 220 is attached to the substrate 210 by a number of die bumps 225. The die bumps 225 provide interconnects with the substrate pads 212 or the substrate bumps 215 on the substrate 210. The die bumps 225 may be fabricated using any standard manufacturing or fabrication techniques. The die 220 is attached to the substrate 210 in a pre-soldering, fluxing, and reflowing phase. At least one of the substrate bumps 215, if used, and the die bumps 215 is made from the composite paste provided by the composite paste formation phase 125 shown in FIG. 1.

Typically, the solder bumps, either the substrate bumps 215 or the die bumps 225, may be built up by depositing the composite paste gradually through either a dry process, such as evaporation, or a wet process, such as electroplating. The evaporation bumping technique is typically used for wafer bumping, such as the controlled collapse chip connection (C4) process. In this process, a metal mask (e.g., molybdenum) is aligned to the bond pads on the wafer and clamped. The under bump metal (UBM) is deposited through evaporation onto the aluminum pads. The composite paste with a pre-determined volume fraction of CNTs and solder paste is then deposited through evaporation onto the UBM surface. The metal mask is then removed. The solder bumps formed are often reflowed to fuse the solder. The electroplating bumping technique is also used for wafer bumping. The wafer is first metallized with a seed metal. It is then patterned with photo-resist with the desired bumping locations exposed. A static or pulsed current is then applied through the plating bath with the wafer as the cathode. After plating, the photo-resist is stripped and the seed metal is etched away. The composite paste is then deposited to the bump locations. The composite paste may then be reflowed with the use of flux to form the solder bumps.

Any other solder bumping techniques may also be employed. In these techniques, the composite paste is used in place of the plain solder. These bumping techniques may include the liquid solder transfer process (e.g., Meniscus bumping, jet bumping), solid solder transfer processes (e.g., wire bumping, sphere welding, laser attachment, decal solder transfer, tacky dot solder transfer, pick-and-place solder transfer, flux-less solder sphere bumping), and solder paste bumping (print-detach-reflow, print-reflow-detach, dispensing). Regardless of what bumping technique used, the composite paste is used in place of the normal solder to provide enhanced interconnects.

Figure 2B:
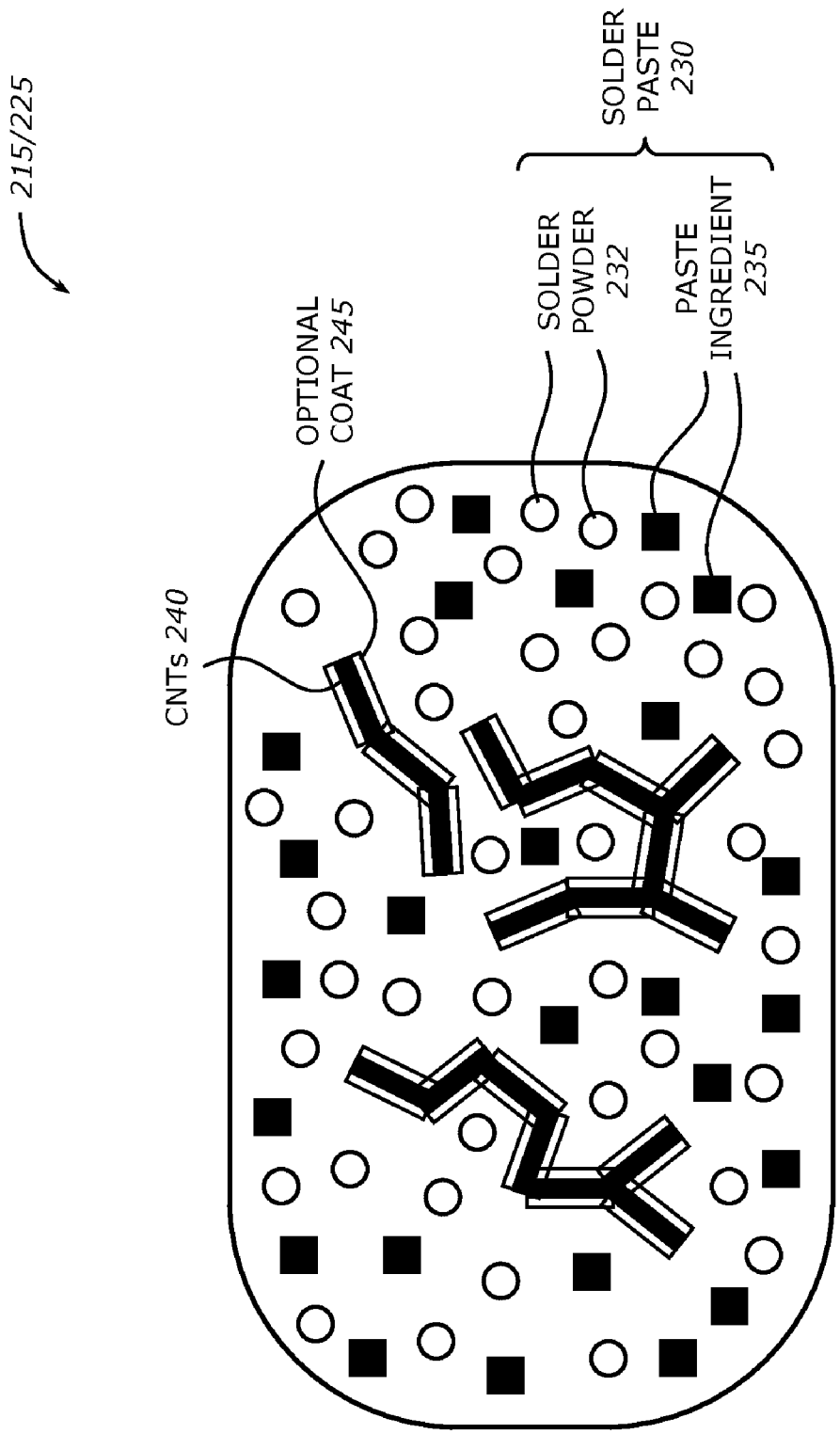
FIG. 2B is a diagram illustrating a solder bump made by a composite paste according to one embodiment of the invention.

FIG. 2B is a diagram illustrating a solder bump 215/225 made by a composite paste according to one embodiment of the invention. The solder bump 215/225 is a mixture including a solder paste 230 and CNTs 240.

The solder paste 230 is a mixture of solder powder 232 and a paste ingredient 235. The solder powder 232 may be powder of a suitable solder material such as tin-lead (Sn/Pb) or lead free alloy with a proper composition. Typically, eutectic alloy powder is used. The paste ingredient 235 may be any suitable ingredient such as a flux, or any other chemical agent that is capable of removing metal oxides and promote spreading of the solder.

The CNTs 240 may be metallic single-wall or multi-wall CNTs dispersed within, or embedded in, the solder paste 230 with a pre-defined volume fraction. They may be long CNTs or short CNTs depending on the process to form the composite paste. Long CNTs may have lengths ranging from approximately 10 µm to 30 µm. Short CNTs may have lengths ranging up to approximately 10 µm. The volume fraction may be determined according to some desired electrical characteristics. It is the ratio between the weight of the CNTs over the entire solder bump 215/225, or the weight percentage of the CNTs with respect to the overall weight. It may be between 30% to 40%. The CNTs 240 may be coated by a carbide-forming element. The carbide-forming element may be one of titanium (Ti), chromium (Cr), vanadium (V), tungsten (W), molybdenum (Mo), and tantalum (Ta)

Figure 3:
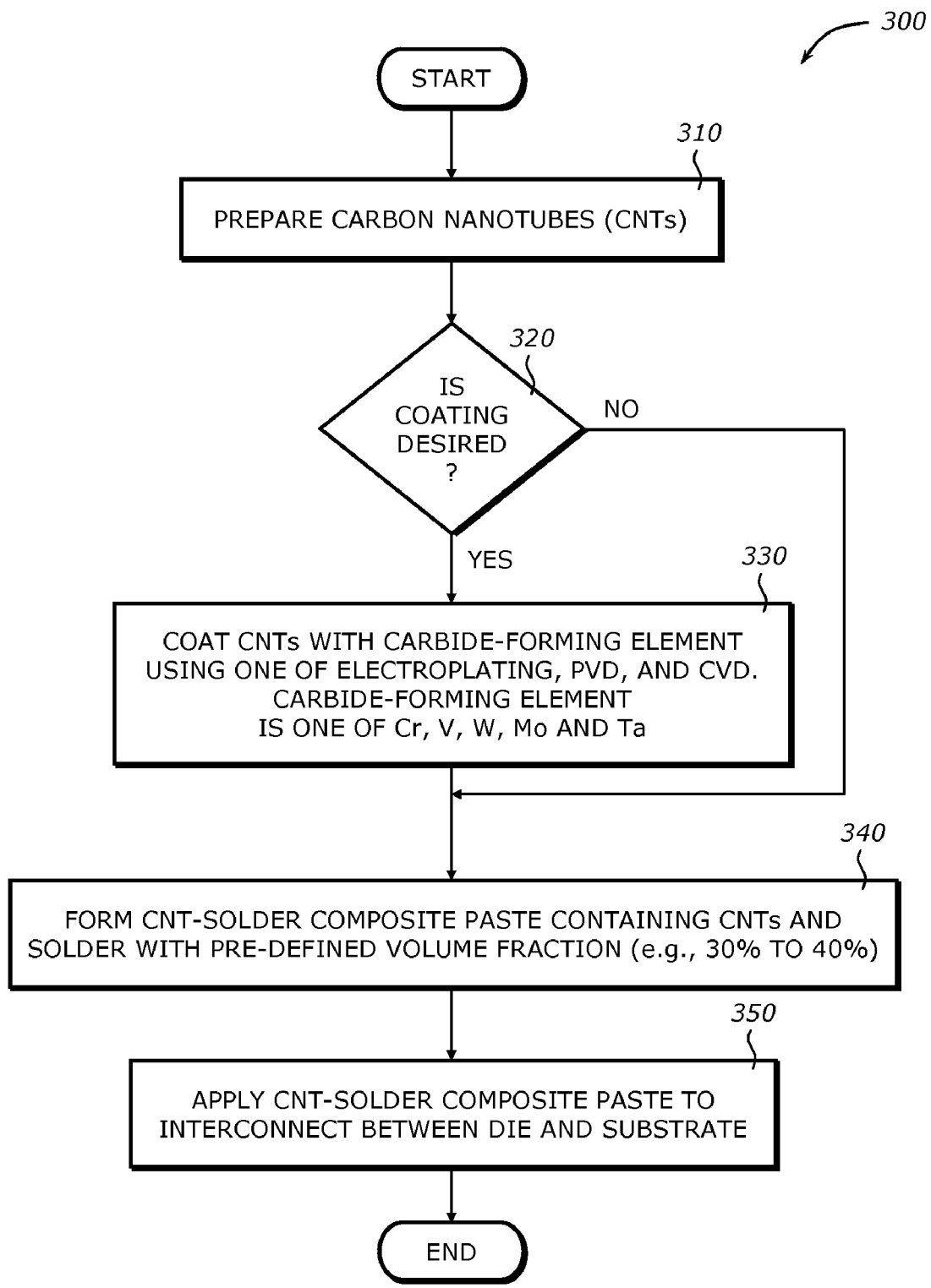
FIG. 3 is a flowchart illustrating a process to form a composite paste according to one embodiment of the invention.

FIG. 3 is a flowchart illustrating a process 300 to form a composite paste according to one embodiment of the invention.

Upon START, the process 300 prepares carbon nanotubes (CNTs) (Block 310). The CNTs may be metallic single-wall or multi-wall CNTs. The CNTs may be prepared, synthesized, functionalized, or obtained using any standard techniques, such as carbon-arc process or electric arc discharge, laser vaporization or ablation, and catalytic chemical vapor deposition (CVP). Next, the process 300 determines if coating is desired (Block 320). Coating may be desired to minimize any contact resistance between the CNTs and the solder after reflow. If coating is not desired, the process 300 proceeds to Block 340. If coating is desired, the process 300 coats the CNTs with a carbide-forming element using one of an electroplating, a physical vapor deposition (PVD), and a chemical vapor deposition (CVD) (Block 330). The carbide-forming element may be any one of titanium (Ti), chromium (Cr), vanadium (V), tungsten (W), molybdenum (Mo), and tantalum (Ta).

Then, the process 300 forms a CNT-solder composite paste containing the CNTs and solder with a pre-defined volume fraction (Block 340). There are at least two methods to form the CNT-solder composite paste as described in FIGS. 4A and 4B. The volume fraction may be defined according to some desired characteristics (e.g., 30% to 40%). Next, the process 300 applies the CNT-solder composite paste to an interconnect between a die and a substrate (Block 350). After solder reflow, the solder may wet the CNTs and a reliable CNT-solder nano-composite interconnect may be formed. The process 300 is then terminated.

Figure 4A:
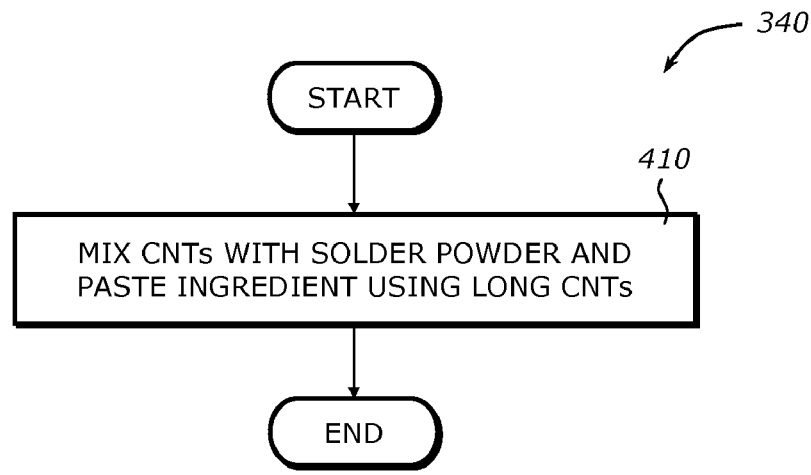
FIG. 4A is a flowchart illustrating a process to form CNT-solder composite paste using long CNTs according to one embodiment of the invention.

FIG. 4A is a flowchart illustrating a process 340 to form CNT-solder composite paste using long CNTs according to one embodiment of the invention.

Upon START, the process 340 mixes the CNTs with solder powder and a paste ingredient (Block 410). Long CNTs having lengths longer than 10 µm are preferred to provide the largest possible ballistically conducting electron path. The mixing is carried out according to the desired volume fraction or weight ratio. The paste ingredient may be any suitable ingredient, agent, additive, such as solvent, flux, etc. The process 340 is then terminated.

Figure 4B:
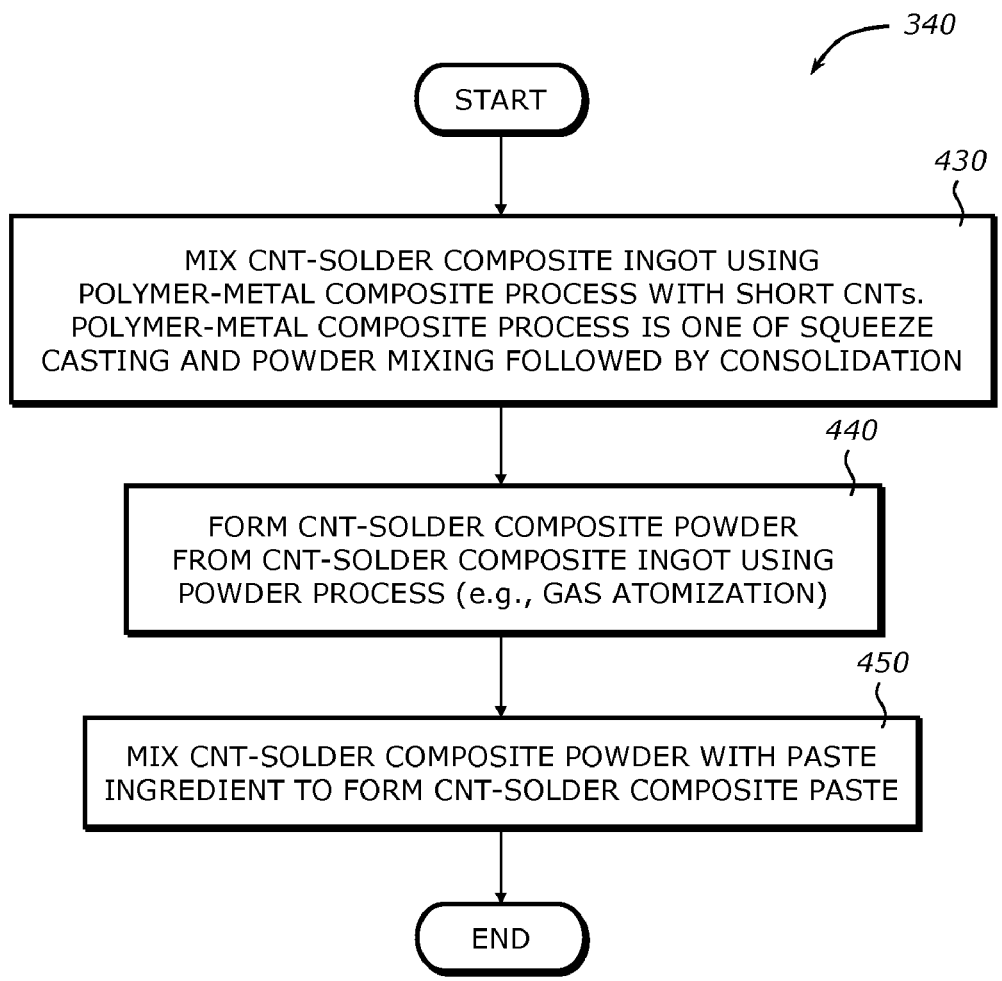
FIG. 4B is a flowchart illustrating a process to form CNT-solder composite paste using short CNTs according to one embodiment of the invention.

FIG. 4B is a flowchart illustrating a process 340 to form CNT-solder composite paste using short CNTs according to one embodiment of the invention.

Upon START, the process 340 forms a CNT-solder composite ingot using a polymer-metal composite process (Block 430). Typically, short CNTs having lengths less than 10 pm are preferred in this process. The polymer-metal composite process is one of a squeeze casting and a powder mixing followed by consolidation. Next, the process 340 forms CNT-solder composite powder from the CNT-solder composite ingot using a powder process (Block 440). Any standard powder process may be used, such as gas atomization. When a typical gas atomization process is used, the CNT-solder composite ingot may flow from a heated crucible through a melt feed tube. It then encounters a high velocity gas stream as it exits the orifice. The liquid is then disintegrated into a collection of liquid droplets in the atomization zone. The droplets become spherical and solidify into powders during their free-fall. Very fine powders may be obtained in this process. Then, the process 340 mixes the CNT-solder composite powder with a paste ingredient such as a flux to form the CNT-solder composite paste (Block 450). The process 340 is then terminated.

Figure 5:
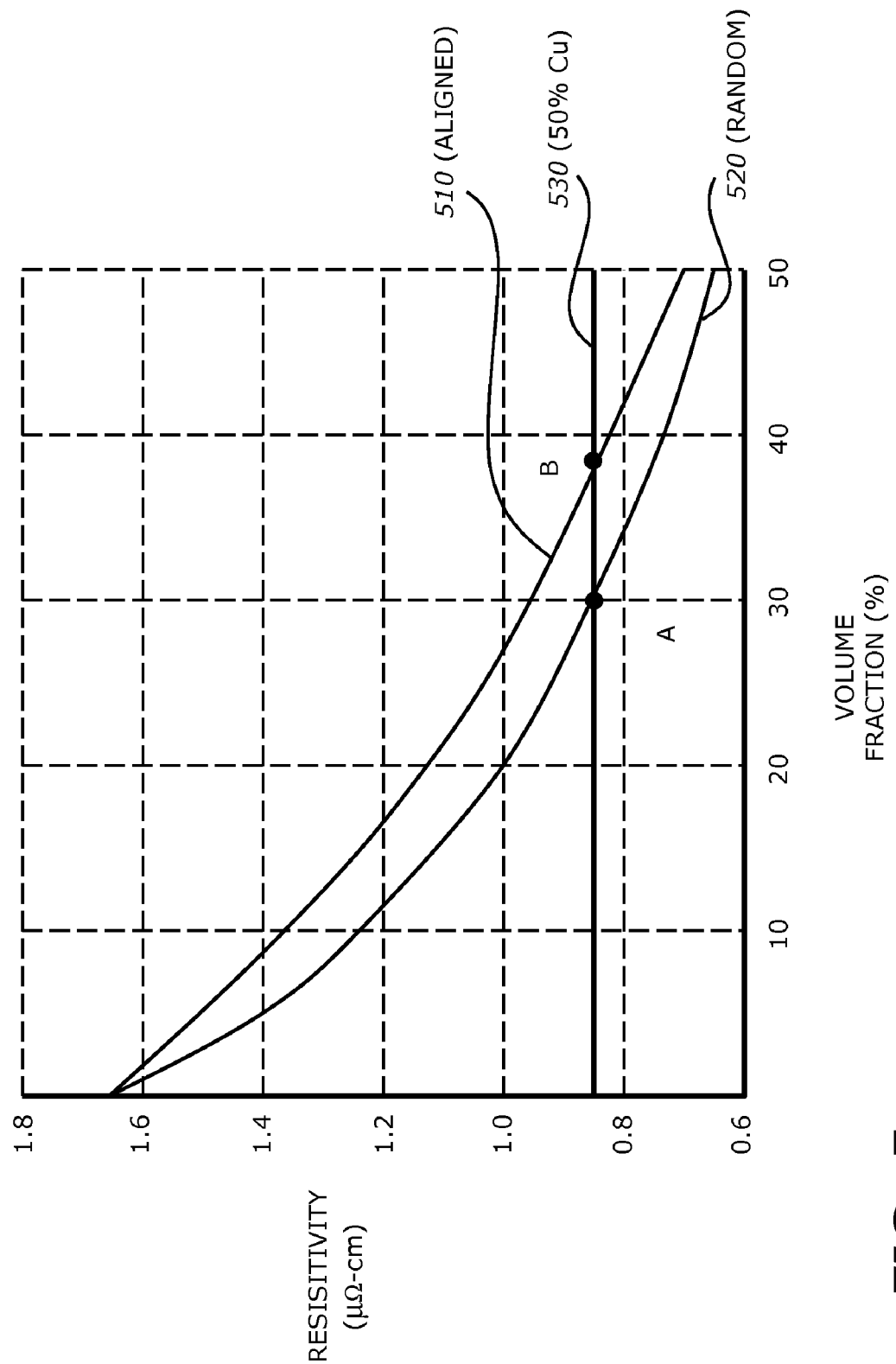
FIG. 5 is a diagram illustrating resistivity reduction as function of CNT volume fraction according to one embodiment of the invention.

FIG. 5 is a diagram illustrating resistivity reduction as function of CNT volume fraction according to one embodiment of the invention. There are two curves: a curve 520 and a curve 520. The curves show the resistivity reduction of a CNT-Cu composite as a function of the volume fraction. The vertical axis is the resistivity in microOhm-cm (µΩ-cm). The horizontal axis in the volume fraction, or the weight ratio, or the filling factor, expressed as a percentage (%).

The curves 510 and 520 are calculated for single-wall CNTs mixed with Cu. The curve 510 corresponds to aligned CNTs. The curve 520 corresponds to random CNTs. At 0% volume fraction, or pure Cu, the resistivity is approximately 1.65 µΩ-cm. Therefore, half of this value is at approximately 0.825 µΩ-cm. This is shown by a straight line 530 shown as 50% Cu. The intersections of the curves 510 and 520 with the line 530 are at points A and B, corresponding to approximately volume fractions of 30% and 40%, respectively. Accordingly, a volume fraction between 30% to 40% may lower the resistivity by 50% compared to pure Cu.

The electro-migration phenomenon is the result of the mass transport of a metal due to the momentum transfer between conducting electrons and diffusing metal atom. The flux of metal atoms due to electro-migration may be expressed using an electrostatic analog and Einstein's equation for diffusion in potential field as follows:

$$J = cD(Z^* epj)/kT \quad (1)$$

where J is the atomic flux, D is the diffusion coefficient for the appropriate mass transport mechanism, Z* is the effective valence or the effective charge that represents the sign and the magnitude of the momentum exchange, p is the resistivity, and j is the current density. kT is the average thermal energy per atom.

From equation (1), the electro-migration induced mass flux is directly proportional to, among others, the resistivity, the current density, and the diffusion coefficient. Accordingly, a lower resistivity lowers the electro-migration atomic flux J and therefore reduces the overall electro-migration process in the solder. Thus, the CNT-solder composite paste, which contains CNTs and solder, lowers the resistivity according to curves 510 and 520, which in turn reduces the overall electro-migration damage to the solder.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A bump comprising:
a solder paste comprising solder powder and a paste ingredient mixed with the solder powder; and
carbon nanotubes (CNTs) dispersed within the solder paste with a pre-defined volume fraction, wherein the pre-defined volume fraction ranges from approximately 30% to 40%, to provide high electrical conductivity; wherein the solder paste is attached to at least one of a die or a package substrate.

2. The bump of claim 1 wherein the CNTs comprises:
long or short CNTs coated with a carbide-forming element.

3. The bump of claim 2 wherein the carbide-forming element is one of titanium (Ti), chromium (Cr), vanadium (V), tungsten (W), molybdenum (Mo), and tantalum (Ta).

4. The bump of claim 2 wherein the long CNTs have lengths ranging from approximately 10 μm to 30 μm.

5. The bump of claim 2 wherein the short CNTs have lengths ranging up to approximately 10 μm.

6. The bump of claim 1 wherein the paste ingredient is a flux.

7. The bump of claim 1 wherein the high electrical conductivity exceeds $10^9$ A/cm$^2$.

8. The bump of claim 1 wherein the solder paste has a current density exceeding $10^4$ A/cm$^2$.

9. A package comprising:
a die having die bumps;
a package substrate having substrate bumps attached to the die via the die bumps, at least one of the die bumps and the substrate bumps being formed by a composite paste, at least one of the die bumps and the substrate bumps comprising:
a solder paste comprising solder powder and a paste ingredient mixed with the solder powder, and carbon nanotubes (CNTs) dispersed within the solder paste with a pre-defined volume fraction, wherein the pre-defined volume fraction ranges from approximately 30% to 40%, to provide high electrical conductivity; wherein the solder paste is attached to at least one of a die or a package substrate.

10. The package of claim 9 wherein the CNTs comprises:
long or short CNTs coated with a carbide-forming element.

11. The package of claim 10 wherein the carbide-forming element is one of titanium (Ti), chromium (Cr), vanadium (V), tungsten (W), molybdenum (Mo), and tantalum (Ta).

12. The package of claim 9 wherein the paste ingredient is a flux.

13. The package of claim 9 wherein the CNTs have lengths ranging from approximately 5 μm to 30 μm.

14. The package of claim 9 wherein the high electrical conductivity exceeds $10^9$ A/cm$^2$.

15. The package of claim 9 wherein the solder paste has a current density exceeding $10^4$ A/cm$^2$.

* * * * *